(12) United States Patent
Okawa

(10) Patent No.: US 11,195,906 B2
(45) Date of Patent: Dec. 7, 2021

(54) SEMICONDUCTOR DEVICE TO SUPPRESS ELECTRIC FIELD CONCENTRATION ON INSULATING PROTECTION FILM

(71) Applicant: Denso Corporation, Kariya (JP)

(72) Inventor: Takashi Okawa, Nagakute (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 16/654,181

(22) Filed: Oct. 16, 2019

(65) Prior Publication Data
US 2020/0127086 A1 Apr. 23, 2020

(30) Foreign Application Priority Data
Oct. 19, 2018 (JP) .............................. JP2018-197644

(51) Int. Cl.
*H01L 29/06* (2006.01)
*H01L 21/02* (2006.01)
*H01L 29/10* (2006.01)
*H01L 29/78* (2006.01)

(52) U.S. Cl.
CPC .... *H01L 29/0619* (2013.01); *H01L 21/02293* (2013.01); *H01L 29/1095* (2013.01); *H01L 29/78* (2013.01)

(58) Field of Classification Search
None
See application file for complete search history.

(56) References Cited

U.S. PATENT DOCUMENTS

2003/0222327 A1* 12/2003 Yamaguchi ......... H01L 29/7802
257/500
2015/0295028 A1* 10/2015 Kagata ................ H01L 29/7813
257/330

FOREIGN PATENT DOCUMENTS

JP 2013-168549 A 8/2013

* cited by examiner

*Primary Examiner* — Nilufa Rahim
(74) *Attorney, Agent, or Firm* — Dinsmore & Shohl LLP

(57) ABSTRACT

A semiconductor device includes a semiconductor substrate that includes an element region and a peripheral withstand voltage region. An insulating protection film is provided above the peripheral withstand voltage region. The peripheral withstand voltage region includes a plurality of guard ring regions of p-type in direct contact with the insulating protection film and a drift region of n-type separating the guard ring regions from each other. Each guard ring region includes a guard ring low concentration region being in direct contact with the insulating protection film and a guard ring high concentration region having a p-type impurity concentration equal to or more than ten times as high as that in the corresponding guard ring low concentration region. Each guard ring high concentration region is provided under the corresponding guard ring low concentration region, and separated from the insulating protection film by the corresponding guard ring low concentration region.

8 Claims, 7 Drawing Sheets

SEMICONDUCTOR DEVICE TO SUPPRESS ELECTRIC FIELD CONCENTRATION ON INSULATING PROTECTION FILM

CROSS REFERENCE TO RELATED APPLICATIONS

This nonprovisional application claims priority to Japanese Patent Application No. 2018-197644 filed on Oct. 19, 2018 with the Japan Patent Office, the entire contents of which are hereby incorporated by reference.

TECHNICAL FIELD

The technique disclosed herein relates to a semiconductor device and a method for manufacturing the same.

BACKGROUND

Japanese Patent Application Publication No. 2013-168549 discloses a semiconductor device that includes a plurality of guard ring regions of p-type (Field Limiting Ring (FLR) regions). The guard ring regions are provided in a peripheral withstand voltage region of a semiconductor substrate. The guard ring regions are separated from each other by a drift region of n-type. A depletion layer can easily extend in the peripheral withstand voltage region due to the guard ring regions, so that electric field in the peripheral withstand voltage region can be reduced. In the semiconductor device described in Japanese Patent Application Publication No. 2013-168549, each guard ring region includes a high concentration region with a higher p-type impurity concentration and a low concentration region with a lower p-type impurity concentration. The low concentration region is provided around the high concentration region. An upper surface of the peripheral withstand voltage region is covered with an insulating protection film. Japanese Patent Application Publication No. 2013-168549 discloses a semiconductor device in which the high concentration region is in direct contact with the insulating protection film, as well as a semiconductor device in which the guard ring region is spaced apart from the insulating protection film.

SUMMARY

In the semiconductor device in which the high concentration region of the guard ring region is in direct contact with the insulating protection film, electric field can be easily concentrated on a surface of the insulating protection film. Such concentration of the electric field on the surface of the insulating protection film is likely to cause creeping discharge between an upper electrode and a lower electrode along the surface of the insulating protection film.

Meanwhile, in the semiconductor device in which the guard ring region is spaced apart from the insulating protection film, the drift region is in direct contact with the insulating protection film above the guard ring region. This configuration can suppress concentration of electric field on the surface of the insulating protection film. However, in this configuration, electric field in the drift region can be easily disturbed by electric charges trapped in the insulating protection film.

This technique disclosed herein therefore proposes a semiconductor device capable of suppressing concentration of electric field on a surface of an insulating protection film and also suppressing influence of electric charges trapped in the insulating protection film.

A semiconductor device may comprise: a semiconductor substrate; an insulating protection film; an upper electrode; and a lower electrode, wherein the semiconductor substrate comprises: an element region; and a peripheral withstand voltage region provided around the element region, the upper electrode is provided above the element region, the insulating protection film is provided above the peripheral withstand voltage region, the lower electrode is provided below the semiconductor substrate, the element region comprises an element capable of allowing a current to flow between the upper electrode and the lower electrode, the peripheral withstand voltage region comprises a plurality of guard ring regions of p-type and a drift region of n-type separating the guard ring regions from each other, each of the guard ring regions comprises a guard ring low concentration region being in direct contact with the insulating protection film and a guard ring high concentration region, and each of the guard ring high concentration regions is provided under the corresponding guard ring low concentration region, comprises a p-type impurity concentration equal to or more than ten times as high as that in the corresponding guard ring low concentration region, and separated from the insulating protection film by the corresponding guard ring low concentration region.

In this semiconductor device, each guard ring high concentration region is provided below the corresponding guard ring low concentration region and is separated from the insulating protection film by the corresponding guard ring low concentration region. That is, each guard ring high concentration region is provided at a position apart from the insulating protection film, and each guard ring low concentration region is in direct contact with the insulating protection film above the corresponding guard ring high concentration region. The guard ring low concentration regions with a low p-type impurity concentration can be easily depleted. Thus, in the guard ring low concentration regions, equipotential lines can be easily dispersed, so that high electric field is less likely to be generated. Since the guard ring low concentration regions with such less susceptibility to high electric field is in direct contact with the insulating protection film in this way, electric field is less likely to be concentrated on a surface of the insulating protection film. Therefore, creeping discharge is less likely to occur in this semiconductor device. Furthermore, since the guard ring low concentration regions are in direct contact with the insulating protection film in this semiconductor device, electric field generated from electric charges trapped in the insulating protection film is less likely to be applied to the drift region. Therefore, electric field in the drift region is less likely to be disturbed. According to this semiconductor device, it is possible to suppress the concentration of electric field on the surface of the insulating protection film, as well as the influence of the electric charges trapped in the insulating protection film.

DETAILED DESCRIPTION

Figure 1:
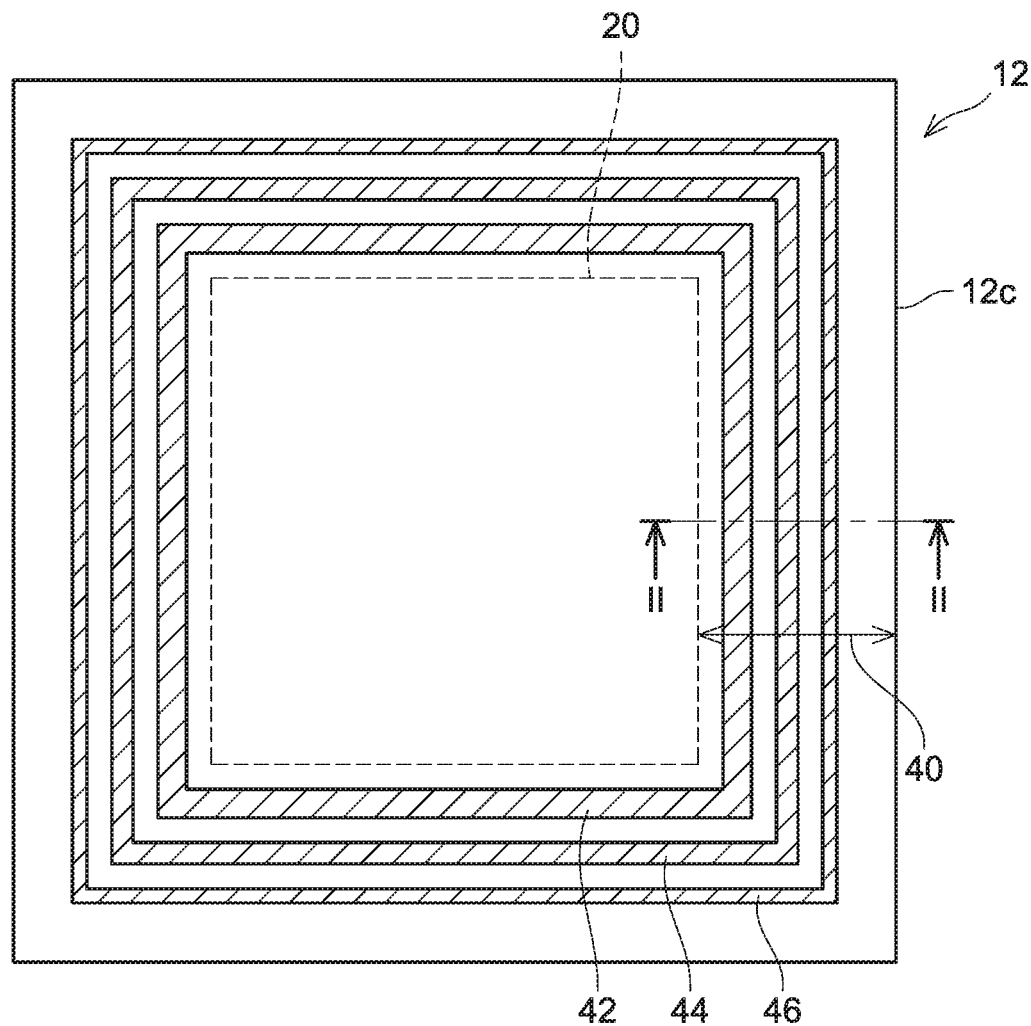
FIG. 1 is a plan view illustrating an arrangement of an element region, a peripheral withstand voltage region, and guard ring regions when a semiconductor device according to an embodiment is viewed from above.
Figure 2:
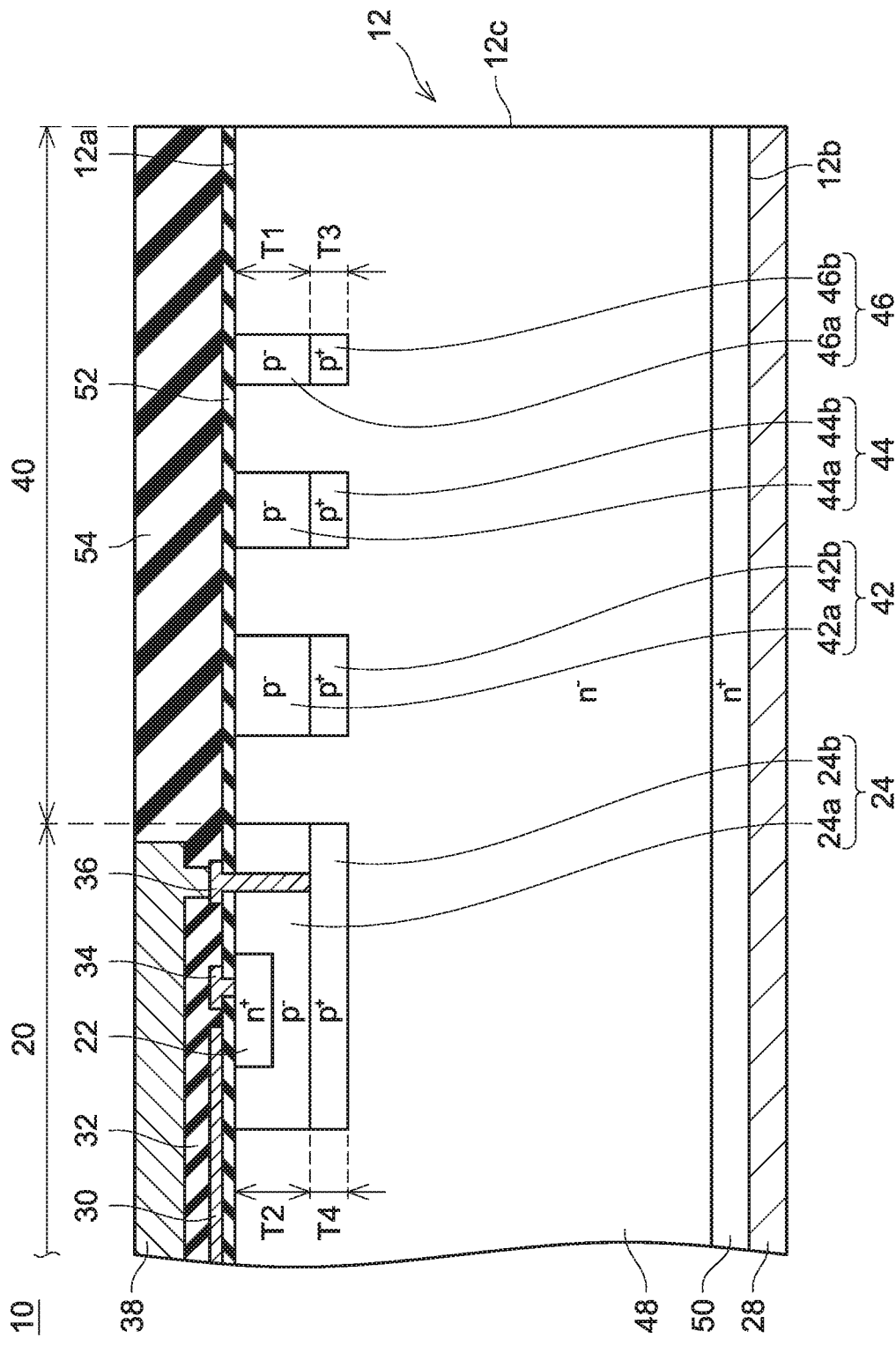
FIG. 2 is a cross-sectional view along line II-II in FIG. 1.

A semiconductor device 10 according to an embodiment illustrated in FIGS. 1 and 2 comprises a semiconductor substrate 12. As illustrated in FIG. 1, an element region 20 is provided in a center portion of the semiconductor substrate 12 in a plan view of an upper surface of the semiconductor substrate 12. A peripheral withstand voltage region 40 is provided between the element region 20 and an outer peripheral end 12c of the semiconductor substrate 12. The peripheral withstand voltage region 40 surrounds the element region 20. A metal-oxide semiconductor field-effect transistor (MOSFET) is formed in the element region 20. A structure for reducing electric field is formed in the peripheral withstand voltage region 40.

As illustrated in FIG. 2, the semiconductor substrate 12 comprises a drain region 50, a drift region 48, body regions 24, source regions 22, and guard ring regions 42, 44, and 46.

The drain region 50 is an n-type region. The drain region 50 is provided by traversing over from the element region 20 to the peripheral withstand voltage region 40. The drain region 50 is provided in a range which borders on a lower surface 12b of the semiconductor substrate 12.

The drift region 48 is an n-type region with a lower n-type impurity concentration than the drain region 50. For example, the n-type impurity concentration in the drift region 48 is $1\times10^{15}$ to $1\times10^{17}$ cm$^{-3}$. The drift region 48 is provided by traversing over from the element region 20 to the peripheral withstand voltage region 40. The drift region 48 is provided on the drain region 50.

The body regions 24 are p-type regions. The body regions 24 are provided in the element region 20. The body regions 24 are provided on the drift region 48. In the element region 20, a plurality of body regions 24 and a plurality of source regions 22 are provided, although not illustrated. The body regions 24 are each provided in a range which borders on an upper surface 12a of the semiconductor substrate 12. At a position where no body region 24 is formed in the element region 20, the drift region 48 extends to reach the upper surface 12a of the semiconductor substrate 12. Each body region 24 includes a low concentration region 24a and a high concentration region 24b. A p-type impurity concentration in the low concentration regions 24a is higher than the n-type impurity concentration in the drift region 48. For example, the p-type impurity concentration in the low concentration regions 24a is $1\times10^{16}$ to $1\times10^{18}$ cm$^{-3}$. The high concentration regions 24b have a p-type impurity concentration equal to or more than ten times as high as that in the low concentration regions 24a. For example, the p-type impurity concentration in the high concentration regions 24b is $1\times10^{19}$ to $1\times10^{20}$ cm$^{-3}$. Each high concentration region 24b is provided on the drift region 48. Each low concentration region 24a is provided on the corresponding high concentration region 24b. Each low concentration region 24a is provided in a range which borders on the upper surface 12a of the semiconductor substrate 12.

The source regions 22 are n-type regions. Each source region 22 is provided in an area surrounded by the corresponding low concentration region 24a of the corresponding body region 24. Each source region 22 is provided in a range which borders on the upper surface 12a of the semiconductor substrate 12. Each source region 22 is separated from the drift region 48 by the corresponding body region 24.

The guard ring regions 42, 44, and 46 are p-type regions. The guard ring regions 42, 44, and 46 are provided in the peripheral withstand voltage region 40. The guard ring regions 42, 44, and 46 are provided in the drift region 48. The guard ring regions 42, 44, and 46 are each provided in a range which borders on the upper surface 12a of the semiconductor substrate 12. The drift region 48 is provided at each interval between the guard ring regions 42, 44, and 46. The guard ring regions 42, 44, and 46 are separated from each other by the drift region 48. As illustrated in FIG. 1, in a plan view of the upper surface 12a of the semiconductor substrate 12, each of the guard ring regions 42, 44, and 46 has a ring shape surrounding a periphery of the element region 20. As illustrated in FIG. 2, the guard ring regions 42, 44, and 46 are arranged in that order from a side close to the element region 20. The guard ring region 44 has a wider width than the guard ring region 46, and the guard ring region 42 has a wider width than the guard ring region 44. The guard ring regions 42, 44, and 46 are separated from the body regions 24 by the drift region 48.

The guard ring regions 42, 44, and 46 include low concentration regions 42a, 44a, and 46a and high concentration regions 42b, 44b, and 46b, respectively. A p-type impurity concentration in the low concentration regions 42a, 44a, and 46a is higher than the n-type impurity concentration in the drift region 48. For example, the p-type impurity concentration in the low concentration regions 42a, 44a, and 46a is $1\times10^{16}$ to $1\times10^{18}$ cm$^{-3}$. The high concentration regions 42b, 44b, and 46b have a p-type impurity concentration equal to or more than ten times as high as that in the low concentration regions 42a, 44a, and 46a. For example, a p-type impurity concentration in the high concentration regions 42b, 44b, and 46b is $1\times10^{19}$ to $1\times10^{20}$ cm$^{-3}$. The high concentration regions 42b, 44b, and 46b are provided on the drift region 48. The low concentration regions 42a, 44a, and 46a are provided on the high concentration regions 42b, 44b, and 46b. The low concentration regions 42a, 44a, and 46a are each provided in a range that borders on the upper surface 12a of the semiconductor substrate 12.

A thickness T1 of the low concentration regions 42a, 44a, and 46a of the guard ring regions is substantially same as a thickness T2 of the low concentration regions 24a of the body regions 24. More specifically, the thickness T1 of the low concentration regions 42a, 44a, and 46a may be within a range of minus to plus ten percent of the thickness T2 of the low concentration regions 24a. For example, the thicknesses T1 and T2 are 0.1 to 1.0 μm. Further, a thickness T3 of the high concentration regions 42b, 44b, and 46b of the guard ring regions is substantially same as a thickness T4 of the high concentration regions 24b of the body regions 24. More specifically, the thickness T3 of the high concentration regions 42b, 44b, and 46b may be within a range of minus to plus ten percent of the thickness T4 of the high concentration regions 24b of the body regions 24.

Above the semiconductor substrate 12 are disposed an insulating oxide film 52, a surface insulation film 54, a gate electrode 30, an interlayer insulation film 32, source contact electrodes 34, body contact electrodes 36, and a main electrode 38.

The insulating oxide film 52 covers the upper surface 12a of the semiconductor substrate 12 in a range which traverses over from the element region 20 to the peripheral withstand voltage region 40. The insulating oxide film 52 is constituted of silicon oxide. In the peripheral withstand voltage region 40, the insulating oxide film 52 covers entire surfaces of the drift region 48 and the guard ring regions 42, 44, and 46. The insulating oxide film 52 is in direct contact with the low concentration regions 42a, 44a, and 46a of the guard ring regions 42, 44, and 46. The high concentration regions 42b, 44b, and 46b are separated from the insulating oxide film 52 by the low concentration regions 42a, 44a, and 46a, respectively. In the element region 20, the insulating oxide film 52 covers a majority of surfaces of the drift region 48, the body regions 24, and the source regions 22. The insulating oxide film 52 above each source region 22 has a contact hole formed therein. Each source contact electrode 34 is provided in the contact hole. Each source contact electrode 34 is in ohmic contact with the corresponding source region 22. Above each high concentration region 24b of each body region 24, a contact hole is provided which penetrates through the insulating oxide film 52 and the corresponding low concentration region 24a. In that contact hole is provided the body contact electrode 36. Each body contact electrode 36 is in ohmic contact with the corresponding high concentration region 24b. Further, each body contact electrode 36 is in direct contact with the corresponding low concentration region 24a.

The gate electrode 30 is provided on the insulating oxide film 52 and is provided above a portion of each low concentration region 24a located between each source region 22 and the drift region 48. The gate electrode 30 is opposed to the portion of each low concentration region 24a which separates each source region 22 and the drift region 48 from each other, via the insulating oxide film 52. The gate electrode 30 is insulated from the semiconductor substrate 12 by the insulating oxide film 52.

The interlayer insulation film 32 covers the gate electrode 30 and the source contact electrodes 34.

The main electrode 38 covers the interlayer insulation film 32. The main electrode 38 is insulated from the gate electrode 30 by the interlayer insulation film 32. The main electrode 38 is in direct contact with the body contact electrodes 36. The main electrode 38 is in direct contact with the source contact electrodes 34 in a cross section that is not illustrated.

The surface insulation film 54 covers the insulating oxide film 52 in the peripheral withstand voltage region 40. The surface insulation film 54 covers an entire surface of the insulating oxide film 52 in the peripheral withstand voltage region 40.

A lower electrode 28 is provided below the semiconductor substrate 12. The lower electrode 28 is in direct contact with the lower surface 12b of the semiconductor substrate 12. The lower electrode 28 is in ohmic contact with the drain region 50.

Next, an operation of the semiconductor device 10 will be described. A MOSFET (metal-oxide-semiconductor field effect transistor) is formed by the source regions 22, the body regions 24, the drift region 48, the drain region 50, and the gate electrode 30 in the element region 20 of the semiconductor substrate 12. When the semiconductor device 10 is used, a potential higher than that applied to the main electrode 38 is applied to the lower electrode 28. When a potential of the gate electrode 30 (hereinafter, referred to as a gate potential) is raised to a gate threshold or higher, a channel is formed in a surface portion (a portion near the insulating oxide film 52) of the body regions 24 below the gate electrode 30, and the source regions 22 are connected to the drift region 48 via the channel. Due to this, electrons flow from the source contact electrodes 34 to the lower electrode 28 through the source regions 22, the channel, the drift region 48, and the drain region 50. That is, the MOSFET is turned on.

When the gate potential is made lower than the gate threshold, the channel is eliminated and the MOSFET is turned off. When the MOSFET is turned off, a reverse voltage is applied to a pn junction at an interface between the body regions 24 and the drift region 48, and therefore a depletion layer spreads from the pn junction to a surrounding region of the pn junction. Almost no depletion layer spreads in the body regions 24 because lower portions of the body regions 24 are configured by the high concentration regions 24b. Because of this, punch-through (a phenomenon that a depletion layer reaches the source region(s) 22) can be prevented. Since almost no depletion layer spreads in the body regions 24, the depletion layer spreads from the body regions 24 to the drift region 48. The drift region 48 in the element region 20 is depleted by the depletion layer spreading from the body regions 24. A voltage between the body regions 24 and the drain region 50 is maintained by the depleted drift region 48.

The depletion layer also spreads to the drift region 48 in the peripheral withstand voltage region 40 from the body regions 24. That is, the depletion layer extends from the body regions 24 toward the outer peripheral end 12c of the semiconductor substrate 12. When reaching the guard ring region 42, the depletion layer extends from the guard ring region 42 toward the guard ring region 44. When reaching the guard ring region 44, the depletion layer extends from the guard ring region 44 toward the guard ring region 46. When reaching the guard ring region 46, the depletion layer extends from the guard ring region 46 toward the outer peripheral end 12c. In this manner, the guard ring regions 42, 44, and 46 facilitate extension of the depletion layer toward the outer peripheral end 12c. Due to this, the depletion layer extends to a portion near the outer peripheral end 12c in the drift region 48. When the MOSFET is turned off, the outer peripheral end 12c of the semiconductor substrate 12 is placed at substantially a same potential as the lower electrode 28. Due to this, a potential difference is generated between the body regions 24 and the outer peripheral end 12c. The potential difference between the body regions 24 and the outer peripheral end 12c is maintained by the depleted drift region 48 in the peripheral withstand voltage region 40.

Further, when the depletion layer has reached the guard ring regions 42, 44, and 46, substantial entireties of the low concentration regions 42a, 44a, and 46a that are low in a p-type impurity concentration are depleted. On the other hand, almost none of the high concentration regions 42b, 44b, and 46b that are high in a p-type impurity concentration are depleted. Therefore, while the MOSFET is off, almost no potential difference is generated inside each of the high concentration regions 42b, 44b, and 46b.

Figure 3:
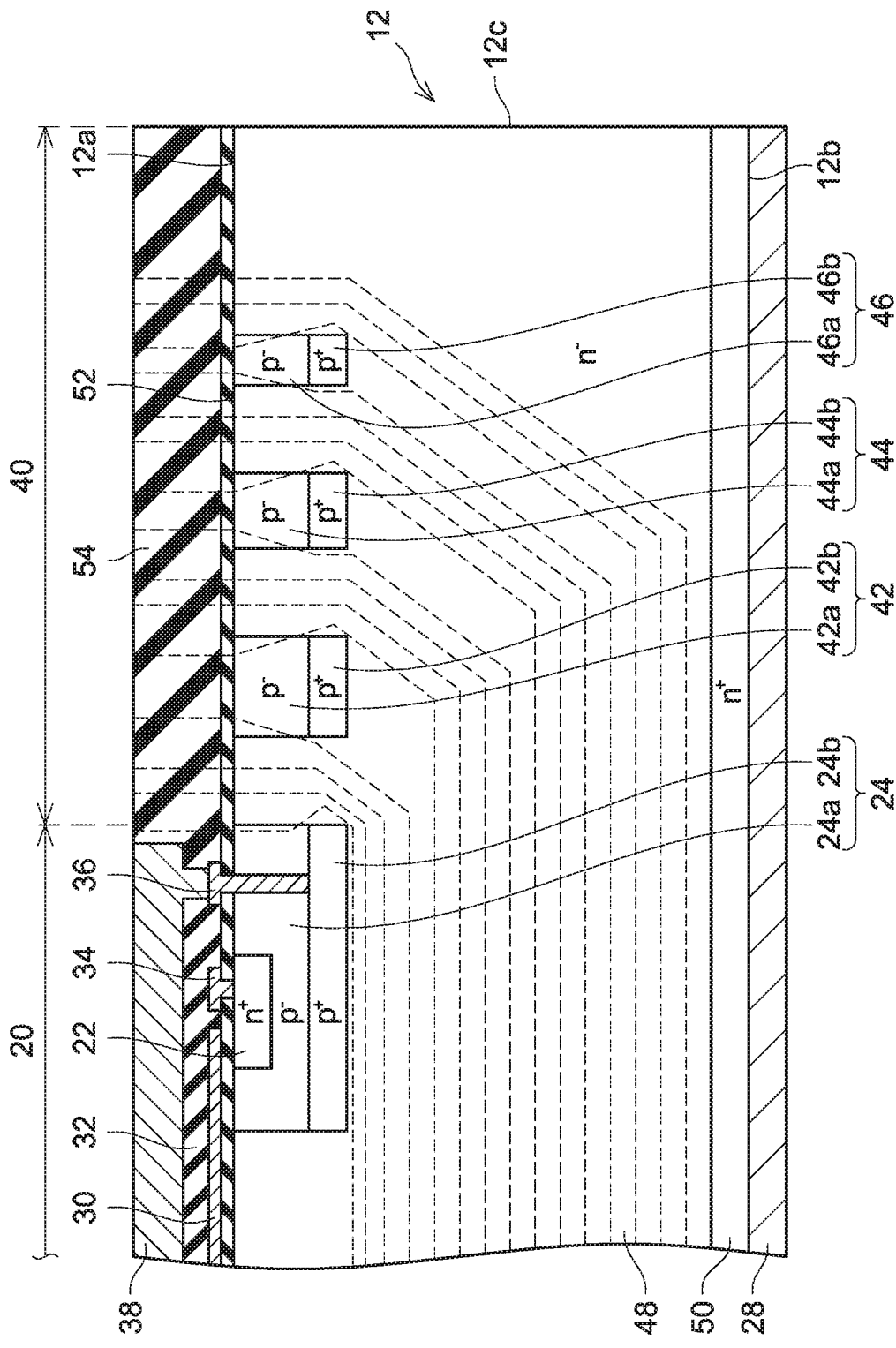
FIG. 3 illustrates a potential distribution in the cross section in FIG. 2 when a MOSFET is off.

FIG. 3 illustrates a potential distribution in the semiconductor device 10 when the MOSFET is off. Broken lines in the cross section in FIG. 3 are equipotential lines. As described above, when the MOSFET is turned off, a voltage between the body regions 24 and the drain region 50 is maintained by the depleted drift region 48 in the element region 20. Due to this, the equipotential lines extend in a lateral direction in the drift region 48 in the element region 20 (a potential difference is generated in a vertical direction). Further, when the MOSFET is turned off, a potential difference between the body regions 24 and the outer peripheral end 12c is maintained by the depleted drift region 48 in the peripheral withstand voltage region 40, as described above.

Due to this, the equipotential lines extend in the vertical direction in a surface portion of the drift region 48 in the peripheral withstand voltage region 40 (the potential difference is generated in the lateral direction). The equipotential lines in the peripheral withstand voltage region 40 are curved and connect to the equipotential lines in the element region 20. As described above, almost none of the high concentration regions 42b, 44b, and 46b of the respective guard ring regions 42, 44, and 46 are depleted, and almost no potential difference is generated in the high concentration regions 42b, 44b, and 46b. Therefore, almost no equipotential lines enter to the high concentration regions 42b, 44b, and 46b, as illustrated in FIG. 3. The equipotential lines are distributed so as to avoid the high concentration regions 42b, 44b, and 46b. On the other hand, the low concentration regions 42a, 44a, and 46a are depleted, and therefore the equipotential lines are distributed to pass through the low concentration regions 42a, 44a, and 46a. Since the low concentration regions 42a, 44a, and 46a are provided above the high concentration regions 42b, 44b, and 46b, the equipotential lines are dispersed above the high concentration regions 42b, 44b, and 46b so as to pass through the low concentration regions 42a, 44a, and 46a. Due to this, each of intervals between the equipotential lines becomes wider in vicinity of the upper surface 12a of the semiconductor substrate 12, so that electric field is reduced. Because of widening of each interval between the equipotential lines in the vicinity of the upper surface 12a of the semiconductor substrate 12, each of the intervals between the equipotential lines becomes wider also in the insulating oxide film 52 and the surface insulation film 54. Therefore, electric field at a surface of the surface insulation film 54 is reduced. Due to this reduction of the electric field at the surface of the surface insulation film 54, occurrence of creeping discharge between the main electrode 38 and the lower electrode 28 along the surface insulation film 54 is suppressed.

Figure 4:
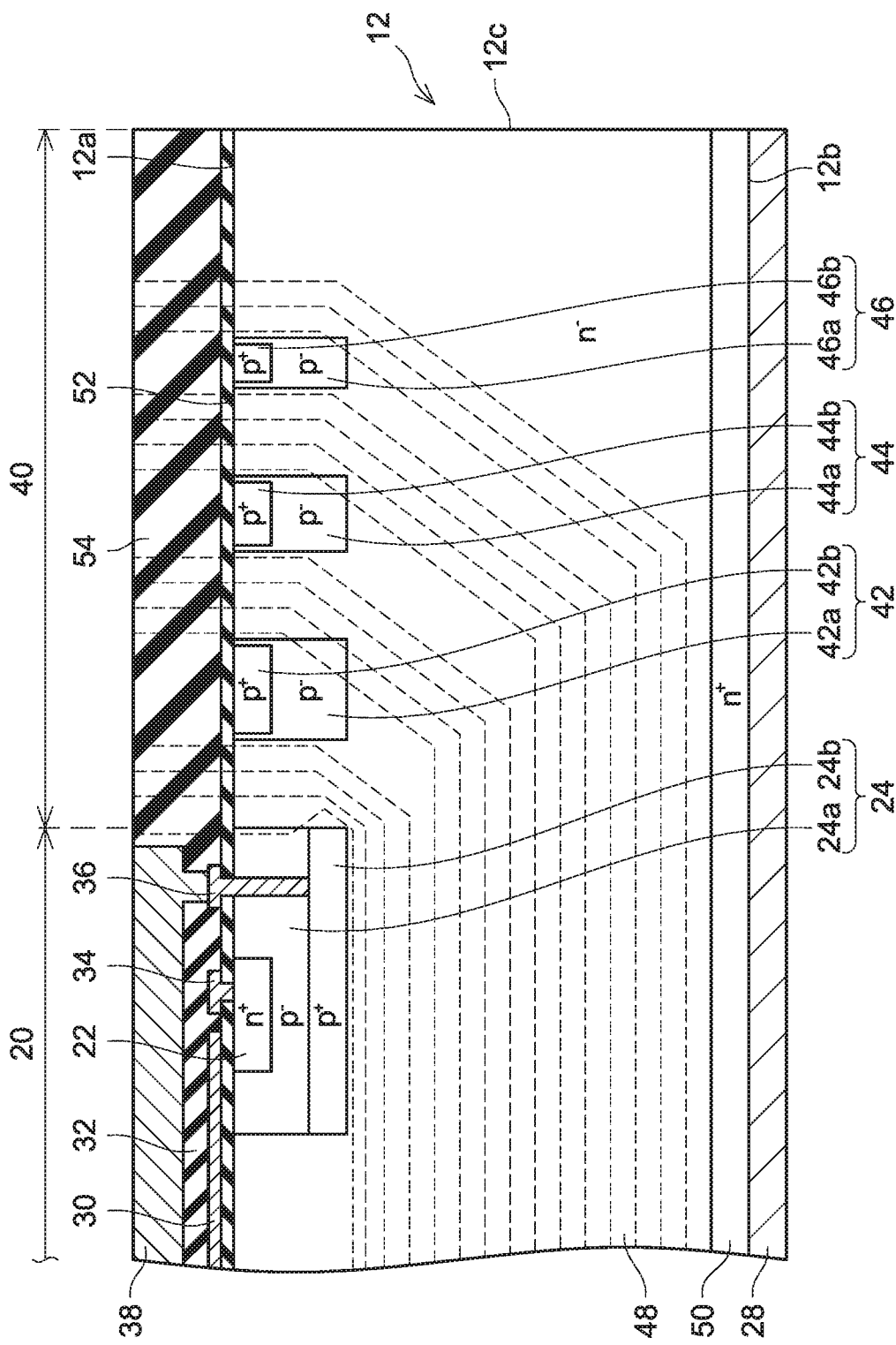
FIG. 4 illustrates a potential distribution in a semiconductor device according to a comparative example.

FIG. 4 illustrates, as a comparative example, a potential distribution (a potential distribution when a MOSFET is off) inside a semiconductor device in which high concentration regions 42b, 44b, and 46b are each formed in a range which borders on the upper surface 12a of the semiconductor substrate 12. Since the high concentration regions 42b, 44b, and 46b are each provided in the range which borders on the upper surface 12a in this semiconductor device, at the upper surface 12a, equipotential lines pass through intervals between the high concentration regions 42b, 44b, and 46b (in a range where the drift region 48 borders on the upper surface 12a). Due to this, each of the intervals between the equipotential lines at the upper surface 12a in FIG. 4 is narrower than those in FIG. 3. Accordingly, each of the intervals between the equipotential lines is narrow also in the insulating oxide film 52 and the surface insulation film 54, and high electric field is generated at the surface of the surface insulation film 54. Further, in the configuration in FIG. 4, when the high concentration regions 42b, 44b, and 46b are formed to be laterally displaced from the low concentration regions 42a, 44a, and 46a because of a manufacturing error or the like, much higher electric field is generated. When high electric field is generated at the surface of the surface insulation film 54, creeping discharge is prone to occur between the main electrode 38 and the lower electrode 28 along the surface of the surface insulation film 54. Contrary to this, according to the semiconductor device 10 of the present embodiment, it is possible to reduce the electric field at the surface of the surface insulation film 54 to suppress creeping discharge, as illustrated in FIG. 3.

In addition, there is a case where electric charges may be trapped in the insulating oxide film 52 and the surface insulation film 54, causing the insulating oxide film 52 and the surface insulation film 54 to be charged. When electric charges are trapped in the insulating oxide film 52 and the surface insulation film 54, a potential distribution in the drift region 48 is disturbed by electric field generated from the trapped electric charges. Here, if the guard ring regions 42, 44, and 46 are not in direct contact with the insulating oxide film 52, the drift region 48 would be in direct contact with the insulating oxide film 52 at the entirety of the upper surface 12a in the peripheral withstand voltage region 40, and the electric field in the drift region 48 would be largely disturbed by the electric field generated from the trapped electric charges. Therefore, concentration of electric field could easily occur in the drift region 48. Contrary to this, because the guard ring regions 42, 44, and 46 are in direct contact with the insulating oxide film 52 as in the present embodiment and the guard ring regions 42, 44, and 46 can shield from the electric field generated from the trapped electric charges, it is possible to suppress influence of the trapped electric charges on the drift region 48. Accordingly, it is possible to suppress disturbance of electric field in the drift region 48. As described above, in the present embodiment, because of direct contact of the guard ring regions 42, 44, and 46 with the insulating oxide film 52, disturbance of electric field in the drift region 48 is suppressed, so that a withstand voltage of the semiconductor device 10 is improved.

Next, a method of manufacturing a semiconductor device 10 will be described. This manufacturing method has features in a formation process of guard ring regions 42, 44, and 46 and body regions 24, and thus a description will be given mainly on the formation of these regions.

Figure 5:
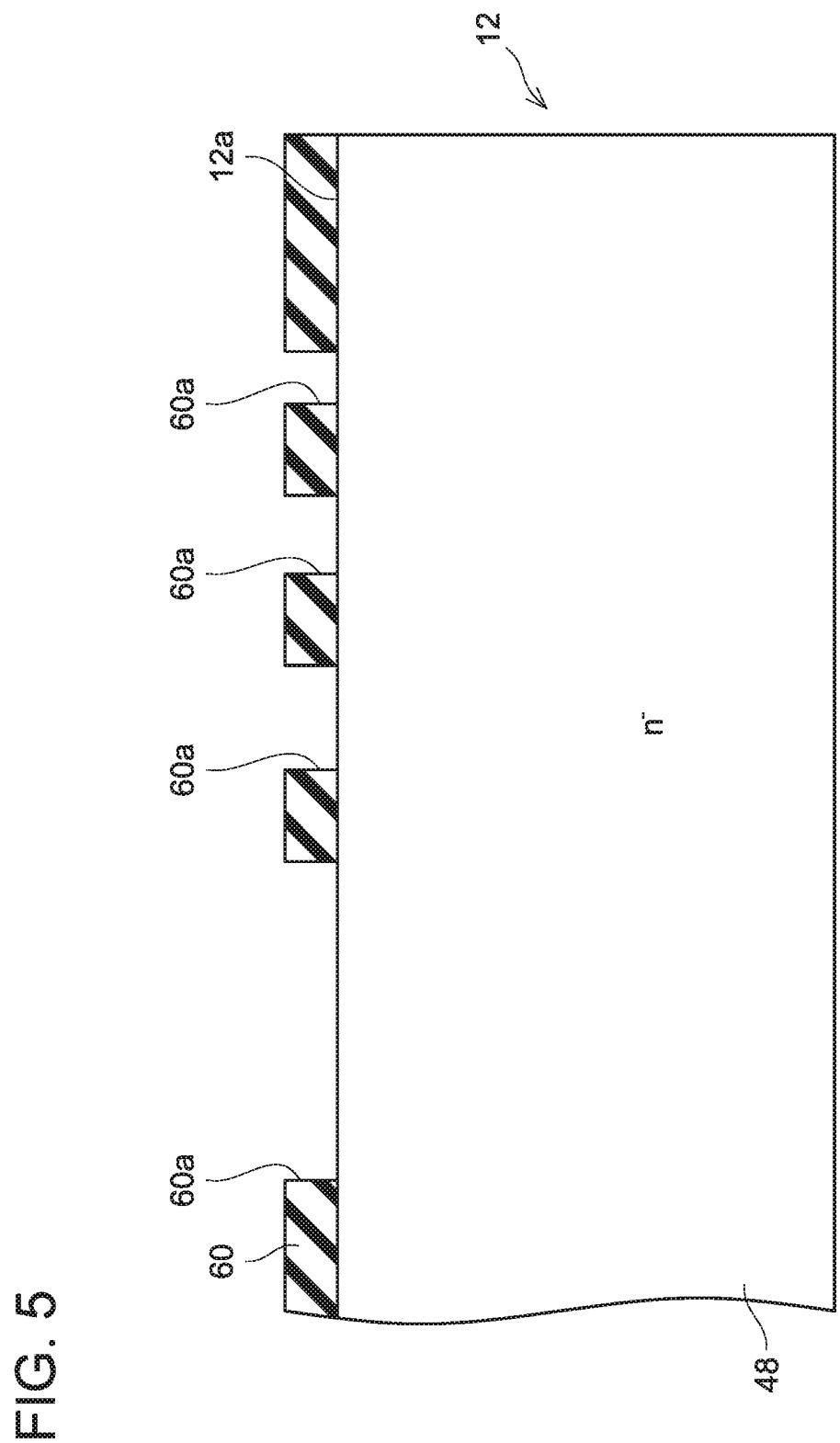
FIG. 5 illustrates a manufacturing method of a semiconductor device according to an embodiment.
Figure 6:
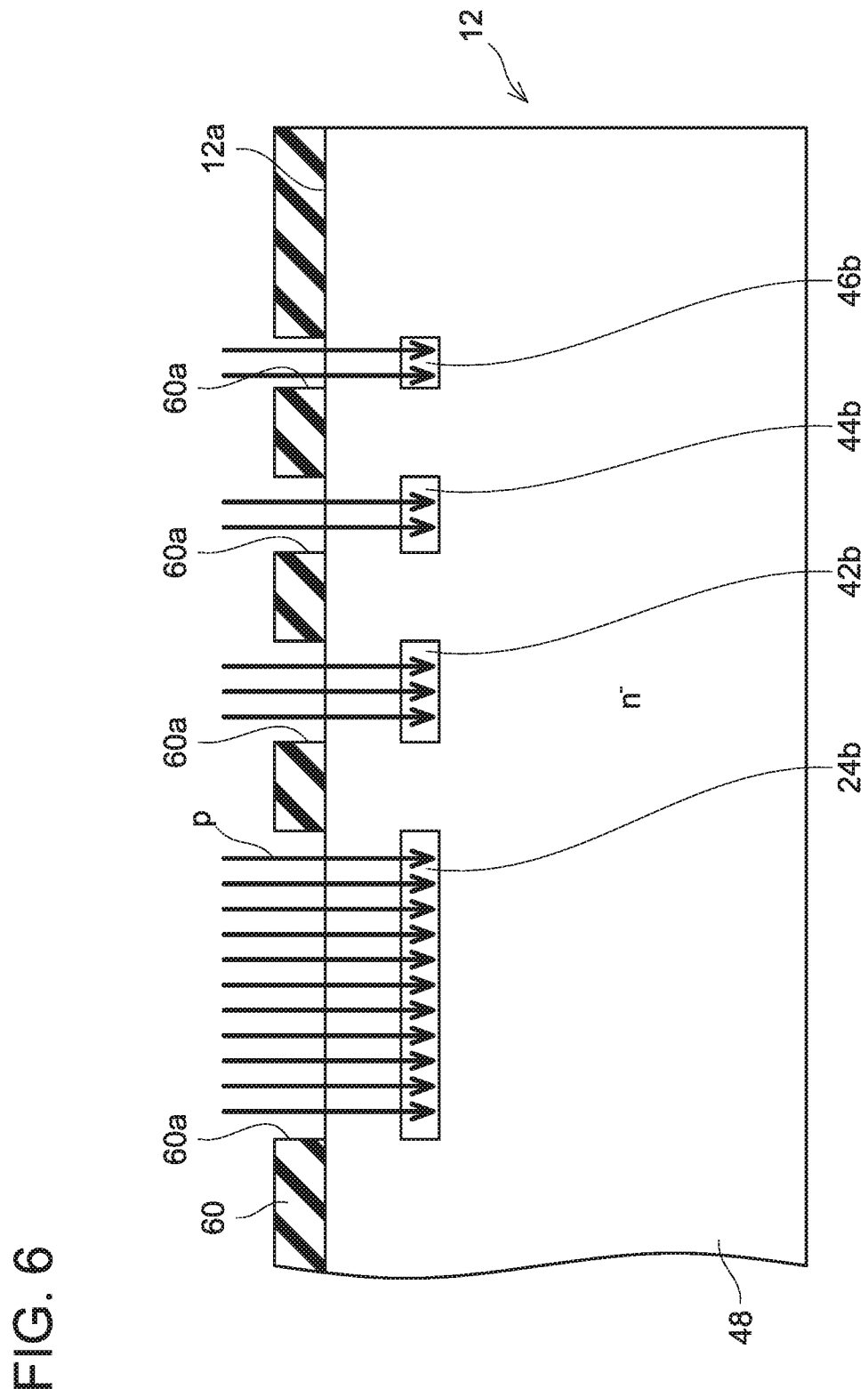
FIG. 6 illustrates the manufacturing method of the semiconductor device according to the embodiment.
Figure 7:
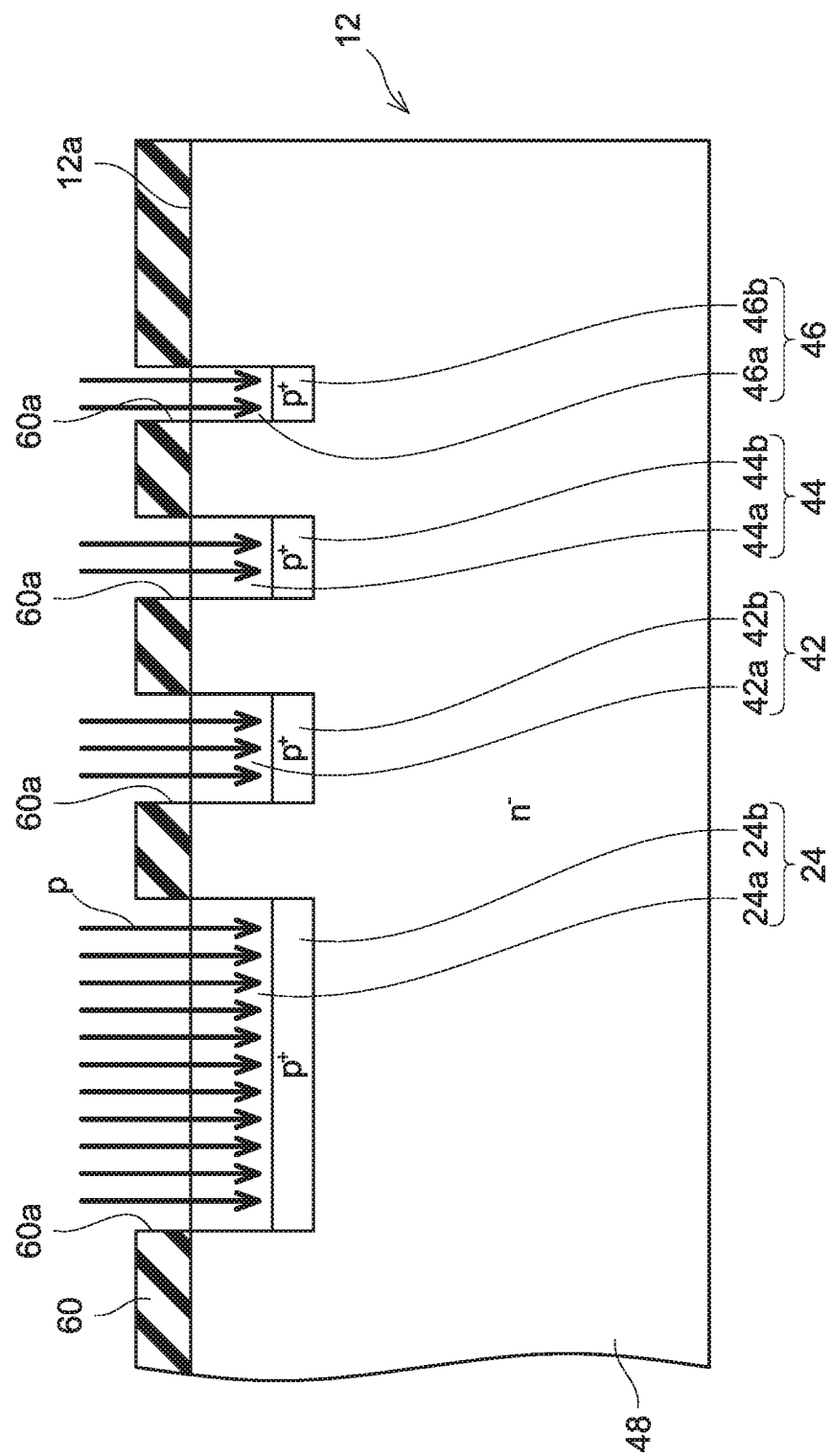
FIG. 7 illustrates the manufacturing method of the semiconductor device according to the embodiment.

First, as illustrated in FIG. 5, a mask 60 having openings 60a is formed on an upper surface 12a of a semiconductor substrate 12 that entirely has a same n-type impurity concentration as a drift region 48 (the semiconductor substrate 12 that has not been processed). The openings 60a are provided above respective ranges where the guard ring regions 42, 44, and 46 and the body regions 24 are to be formed. Subsequently, as illustrated in FIG. 6, p-type impurities are implanted into the upper surface 12a of the semiconductor substrate 12 via the mask 60. By this implantation, the high concentration regions 24b, 42b, 44b, and 46b are formed below the openings 60a. Subsequently, as illustrated in FIG. 7, p-type impurities are implanted into the upper surface 12a of the semiconductor substrate 12 via the mask 60 with a lower implantation energy than that in FIG. 6. By this implantation, low concentration regions 24a, 42a, 44a, and 46a are formed above the high concentration regions 24b, 42b, 44b, and 46b. By these processes, the body regions 24 and the guard ring regions 42, 44, and 46 can be formed. Thereafter, source regions 22, a drain region 50, electrodes, insulation films, and the like are formed, thereby obtaining the semiconductor device 10 illustrated in FIGS. 1 and 2.

According to the above manufacturing method, the high concentration regions 24b of the body regions 24 and the high concentration regions 42b, 44b, and 46b of the guard ring regions 42, 44, and 46 can be formed at the same time by a shared ion implantation. Therefore, the semiconductor device 10 can be efficiently manufactured. Further, by this method, as illustrated in FIG. 2, the thickness T4 of the high concentration regions 24b becomes substantially the same as the thickness T3 of the high concentration regions 42b, 44b, and 46b.

In addition, according to the above manufacturing method, the low concentration regions 24a of the body regions 24 and the low concentration regions 42a, 44a, and 46a of the guard ring regions 42, 44, and 46 can be formed at the same time by a shared ion implantation. Therefore, the semiconductor device 10 can be efficiently manufactured. Further, as illustrated in FIG. 2, according to this method, the thickness T2 of the low concentration regions 24a becomes substantially the same as the thickness T1 of the low concentration regions 42a, 44a, and 46a.

Furthermore, according to the above manufacturing method, the high concentration regions 24b, 42b, 44b, and 46b and the low concentration regions 24a, 42a, 44a, and 46a can be formed by using the shared mask 60. Therefore, the semiconductor device 10 can be efficiently manufactured.

Even without ion implantation for the low concentration regions 42a, 44a, and 46a, low concentration regions are formed by p-type impurities that diffuse from the high concentration regions 42b, 44b, and 46b around the high concentration regions 42b, 44b, and 46b. However, by performing ion implantation for the low concentration regions 42a, 44a, and 46a separately from the ion implantation for the high concentration regions 42b, 44b, and 46b as in the above manufacturing method, the thickness T1 of the low concentration regions 42a, 44a, and 46a can be made thicker. The thicker thickness T1 of the low concentration regions 42a, 44a, and 46a facilitates dispersion of equipotential lines above the high concentration regions 42b, 44b, and 46b, so that it is possible to further reduce the electric field at the surface of the surface insulation film 54. Therefore, it is possible to suppress creeping discharge more effectively.

Formation of the low concentration regions 24a, 42a, 44a, and 46a may be performed prior to formation of the high concentration regions 24b, 42b, 44b, and 46b.

Further, although the high concentration regions 24b, 42b, 44b, and 46b and the low concentration regions 24a, 42a, 44a, and 46a are formed by ion implantations in the above manufacturing method, these regions may be formed by epitaxial growth. For example, a high-concentration p-layer is epitaxially grown on a drift region 48, a low-concentration p-layer is epitaxially grown on the high-concentration p-layer, and etching is performed to divide the high-concentration p-layer and the low-concentration p-layer into a plurality of regions such that high concentration regions 24b, 42b, 44b, and 46b and low concentration regions 24a, 42a, 44a, and 46a can be formed. In the etched region, the drift region 48 is made to grow. According to this method, the high concentration regions 24b, 42b, 44b, and 46b can be formed by shared epitaxial growth, and the low concentration regions 24a, 42a, 44a, and 46a can be formed by shared epitaxial growth.

A relationship between the components in the embodiment and the components in claims is described below. The source contact electrodes 34, the body contact electrodes 36, and the main electrode 38 in the embodiment are examples of an upper electrode in the claims. A stacked portion of the insulating oxide film 52 and the surface insulation film 54 in the embodiment is an example of an insulating protection film in the claims. The MOSFET in the embodiment is an example of an element in the claims. The body regions 24 in the embodiment are an example of an element p-type region in the claims.

Some of the features characteristic disclosed herein will be listed. It should be noted that the respective technical elements are independent of one another, and are useful solely or in combinations.

In an example of a semiconductor device disclosed herein, the element region may comprise an element p-type region being in direct contact with the upper electrode. The drift region may extend into the element region and may be in direct contact with the element p-type region from below. The element p-type region may comprise an element low concentration region and an element high concentration region. The element low concentration region may be in direct contact with the upper electrode. The element high concentration region may be provided between the element low concentration region and the drift region and may comprise a p-type impurity concentration equal to or more than ten times as high as that in the element low concentration region.

In an example of the semiconductor device disclosed herein, a thickness of the element low concentration region may be substantially same as a thickness of the guard ring low concentration regions.

The feature that the element low concentration region has substantially the same thickness as the guard ring low concentration regions means that the thickness of the element low concentration region may be within a range of minus to plus ten percent of the thickness of the guard ring low concentration regions.

With this configuration, the element low concentration region and the guard ring low concentration regions can be formed by shared p-type impurity implantation or shared epitaxial growth.

In an example of the semiconductor device disclosed herein, a thickness of the element high concentration region may be substantially same as a thickness of the guard ring high concentration regions.

The feature that the element high concentration region has substantially the same thickness as the guard ring high concentration regions means that the thickness of the element high concentration region may be within a range of minus to plus ten percent of the thickness of the guard ring high concentration regions.

With this configuration, the element high concentration region and the guard ring high concentration regions can be formed by a shared p-type impurity implantation or shared epitaxial growth.

In addition, a method of manufacturing the semiconductor device disclosed herein may comprise: forming guard ring high concentration regions by p-type impurity implantation or epitaxial growth; and forming guard ring low concentration regions by p-type impurity implantation or epitaxial growth.

Either of formation of the guard ring high concentration region or formation of the guard ring low concentration regions may be performed prior to the other.

With this configuration, the guard ring low concentration region can have an enough thickness, so that electric field on a surface of the insulating protection film can be effectively reduced.

In addition, a method of manufacturing the semiconductor device disclosed herein may comprise: forming guard ring high concentration regions and an element high concentration region by p-type impurity implantation or epitaxial growth; and forming guard ring low concentration regions and an element low concentration region by p-type impurity implantation or epitaxial growth.

With this configuration, the element low concentration region and the guard ring low concentration regions can be formed by shared p-type impurity implantation or shared epitaxial growth. Moreover, the element high concentration region and the guard ring high concentration regions can be formed by shared p-type impurity implantation or shared epitaxial growth.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A semiconductor device, comprising:
a semiconductor substrate;
an insulating protection film;
an upper electrode; and
a lower electrode,
wherein
the semiconductor substrate comprises:
an element region; and
a peripheral withstand voltage region provided around the element region,
the upper electrode is provided above the element region,
the insulating protection film is provided above the peripheral withstand voltage region,
the lower electrode is provided below the semiconductor substrate,
the element region comprises an element capable of allowing a current to flow between the upper electrode and the lower electrode,
the peripheral withstand voltage region comprises a plurality of guard ring regions of p-type and a drift region of n-type separating the guard ring regions from each other,
each of the guard ring regions comprises a guard ring low concentration region being in direct contact with the insulating protection film and a guard ring high concentration region, and
each of the guard ring high concentration regions is provided under the corresponding guard ring low concentration region, comprises a p-type impurity concentration equal to or more than ten times as high as that in the corresponding guard ring low concentration region, and is separated from the insulating protection film by the corresponding guard ring low concentration region.

2. The semiconductor device of claim 1, wherein
the element region comprises an element p-type region being in direct contact with the upper electrode,
the drift region extends into the element region and is in direct contact with the element p-type region from below, and
the element p-type region comprises an element low concentration region being in direct contact with the upper electrode and an element high concentration region provided between the element low concentration region and the drift region and comprising a p-type impurity concentration equal to or more than ten times as high as that in the element low concentration region.

3. The semiconductor device of claim 2, wherein a thickness of the element low concentration region is substantially same as a thickness of the guard ring low concentration regions.

4. The semiconductor device of claim 2, wherein a thickness of the element high concentration region is substantially same as a thickness of the guard ring high concentration regions.

5. A method of manufacturing the semiconductor device of claim 2, the method comprising:
forming the guard ring high concentration regions and the element high concentration region by p-type impurity implantation or epitaxial growth; and
forming the guard ring low concentration regions and the element low concentration region by p-type impurity implantation or epitaxial growth.

6. A method of manufacturing the semiconductor device of claim 1, the method comprising:
forming the guard ring high concentration regions by p-type impurity implantation or epitaxial growth; and
forming the guard ring low concentration regions by p-type impurity implantation or epitaxial growth.

7. The semiconductor device of claim 1, wherein in a plan view of an upper surface of the semiconductor substrate, each of the guard ring regions comprises a ring shape surrounding a periphery of the element region.

8. The semiconductor device of claim 1, wherein:
the semiconductor substrate comprises a drain region of n-type comprising an n-type impurity concentration higher than an n-type impurity concentration in the drift region, extending continuously from the element region to the peripheral withstand voltage region, and being ohmic contact with the lower electrode in both of the element region and the peripheral withstand voltage region; and
the drift region extends continuously from the element region to the peripheral withstand voltage region, is provided on the drain region in both of the element region and the peripheral withstand voltage region, and separates the guard ring regions from the drain region.

* * * * *